(12) United States Patent
Moorhead et al.

(10) Patent No.: US 9,160,190 B2
(45) Date of Patent: Oct. 13, 2015

(54) SYSTEM AND METHOD FOR ASSESSING ADC OPERATION AND VOLTAGE OF A BATTERY PACK

(75) Inventors: Brian C. Moorhead, Willis, MI (US); Paul W. Firehammer, Saline, MI (US)

(73) Assignee: A123 Systems LLC, Livonia, MI (US)

( * ) Notice: Subject to any disclaimer, the term of this patent is extended or adjusted under 35 U.S.C. 154(b) by 418 days.

(21) Appl. No.: 13/636,327

(22) PCT Filed: Mar. 23, 2011

(86) PCT No.: PCT/US2011/029525
§ 371 (c)(1),
(2), (4) Date: Oct. 2, 2012

(87) PCT Pub. No.: WO2011/119671
PCT Pub. Date: Sep. 29, 2011

(65) Prior Publication Data
US 2013/0119941 A1     May 16, 2013

Related U.S. Application Data (60) Provisional application No. 61/316,463, filed on Mar. 23, 2010.

(51) Int. Cl.
| | |
|---|---|
| H02J 7/00 | (2006.01) |
| H01M 2/10 | (2006.01) |
| H01M 10/48 | (2006.01) |
| B60L 3/12 | (2006.01) |
| B60L 11/18 | (2006.01) |
| G01R 31/36 | (2006.01) |
| G01R 35/00 | (2006.01) |

(52) U.S. Cl.
CPC .............. *H02J 7/0063* (2013.01); *B60L 3/12* (2013.01); *B60L 11/1857* (2013.01); *B60L 11/1864* (2013.01); *B60L 11/1866* (2013.01); *G01R 31/3648* (2013.01); *H01M 2/1072* (2013.01); *H01M 10/482* (2013.01); *H02J 7/0052* (2013.01); *G01R 31/362* (2013.01); *G01R 35/00* (2013.01); *Y02T 10/7005* (2013.01); *Y02T 10/7011* (2013.01); *Y02T 10/7061* (2013.01)

(58) Field of Classification Search
CPC .. G01R 1/3648; G01R 31/3658; H02J 7/0052
USPC .................................. 320/136, 162; 324/434
See application file for complete search history.

(56) References Cited

U.S. PATENT DOCUMENTS

| | | | |
|---|---|---|---|
| 5,983,137 A | 11/1999 | Yerkovich | |
| 6,332,113 B1 | 12/2001 | Bertness | |
| 7,816,892 B2 * | 10/2010 | Chen | ............................ 320/162 |

(Continued)

OTHER PUBLICATIONS

ISA Korea, International Search Report and Written Opinion of PCT/US2011/029525, Dec. 9, 2011, WIPO, 10 pages.

*Primary Examiner* — Sun Lin
(74) *Attorney, Agent, or Firm* — Alleman Hall McCoy Russell & Tuttle LLP (57) ABSTRACT

Systems and methods for assessing operation of analog digital converters (ADCs) of a battery pack supplying power to a vehicle are disclosed. One example system comprises, a first ADC for determining a voltage of at least one battery cell; a second ADC for determining a voltage of a plurality of battery cells; and a controller performing an action in response to comparing an output of said first ADC to an output of said second ADC.

20 Claims, 4 Drawing Sheets

(56) References Cited

U.S. PATENT DOCUMENTS

| | | | |
|---|---|---|---|
| 8,531,160 B2* | 9/2013 | Moorhead et al. | 320/136 |
| 2009/0099802 A1 | 4/2009 | Barsoukov et al. | |
| 2009/0115371 A1 | 5/2009 | Chawla et al. | |
| 2009/0179650 A1 | 7/2009 | Omagari | |
| 2012/0074904 A1* | 3/2012 | Rutkowski et al. | 320/112 |
| 2012/0306449 A1* | 12/2012 | Tagami et al. | 320/118 |

* cited by examiner

SYSTEM AND METHOD FOR ASSESSING ADC OPERATION AND VOLTAGE OF A BATTERY PACK

CROSS REFERENCE TO RELATED APPLICATIONS

This application claims priority from International Patent Application Serial No. PCT/US2011/029525, filed Mar. 23, 2011 and entitled SYSTEM AND METHOD FOR ASSESSING ADC OPERATION AND VOLTAGE OF A BATTERY PACK, which claims priority to U.S. Provisional Patent Application Ser. No. 61/316,463, filed Mar. 23, 2010 and entitled SYSTEM AND METHOD FOR ASSESSING ADC OPERATION AND VOLTAGE OF A BATTERY PACK, the entirety of both which are hereby incorporated herein by reference for all intents and purposes.

TECHNICAL FIELD

The present description relates to assessing operation of analog to digital converters (ADC) of a battery pack supplying power to a vehicle.

BACKGROUND AND SUMMARY

When lithium-ion batteries are configured to supply and store power from a vehicle they may be exposed to many charging and discharging cycles. For example, during a discharge cycle the battery may provide power to propel the vehicle, cool vehicle occupants, and provide entertainment. On the other hand, during a charging cycle the battery may be supplied power from a power supply or from vehicle wheels. However, if battery cells are charged more than a desired amount or discharged more than a desired amount the battery cells may degrade. Therefore, it may be desirable to accurately determine the state (e.g., voltage) of one or more battery cells so that battery charging or discharging may be limited during some conditions.

ADCs are one way to determine battery charge. In one example, the voltage of individual battery cells may be determined by selectively coupling individual battery cells to a higher resolution ADC (e.g., 12 bit resolution). If a particular battery cell is above a desired voltage, the particular battery cell can be discharged based on the ADC output. In this way, it is possible to determine and regulate charge of individual battery cells.

However, when only a single ADC is used to determine battery cell voltage, it may be more difficult to determine degradation of the battery cell voltage measurement. For example, if the ADC output drifts beyond an expected threshold amount, it may be difficult to determine that the ADC output is drifting. Further, it may be difficult to determine if there is degradation of circuitry between the battery cell and the ADC. For example, if switching circuitry between the ADC and battery cells does not switch in a desired manner, the ADC may read the same battery cell more times than is desired.

The inventor herein has developed a system for assessing ADC operation and voltage of a battery, comprising: a first ADC for determining the voltage of at least one battery cell; a second ADC for determining the voltage of a plurality of battery cells; and a controller performing an action in response to comparing an output of said first ADC to an output of said second ADC.

By comparing the output of one ADC to the output of another ADC, it may be possible to determine if circuitry or ADC output has degraded. In one embodiment, a first single higher resolution ADC may be selectively coupled to one or more battery cells. The first ADC output of the battery cell voltage may be stored to memory of a microcontroller during the time period that the first ADC is coupled to the battery cell. Once the first higher resolution ADC has stored the voltage of each battery cell of a battery cell stack to memory, a second lower resolution ADC may be coupled to the series combination of the same battery cells to determine the voltage of the plurality of battery cells. In particular, a microcontroller may then compare the sum of individual battery cell voltages as measured by the first higher resolution ADC to the battery cell voltage formed by the physical series combination of the same battery cells and as indicated by the second lower resolution ADC. Thus, the output of the first higher resolution ADC may be compared to the output of the second lower resolution ADC. If the output of one ADC is different from the output of the other ADC by more than a predetermined amount, the microcontroller may take an action. For example, if the output of one ADC is greater than the output of the other ADC by more than a predetermined amount, the battery pack may indicate that it is desirable to service the battery pack.

The present description may provide several advantages. For example, the approach may provide improved control over the state of charge of a battery pack because the battery pack may be operated closer to operational limits Further, the approach may provide improved battery cell diagnostics. Further still, the approach may provide alternative ways to operate the battery pack since the second ADC may still provide useful battery data even if operation of the first ADC has degraded. In addition, the approach may increase battery life as a higher percentage of the available battery capacity may be utilized.

The above advantages and other advantages, and features of the present description will be readily apparent from the following Detailed Description when taken alone or in connection with the accompanying drawings.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION OF THE DEPICTED EMBODIMENTS

Figure 1:
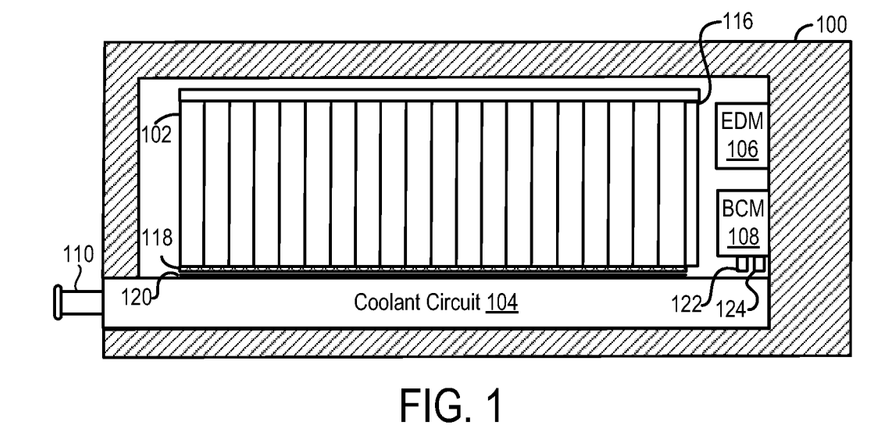
FIG. 1 shows a schematic view of a battery control system.
Figure 2:
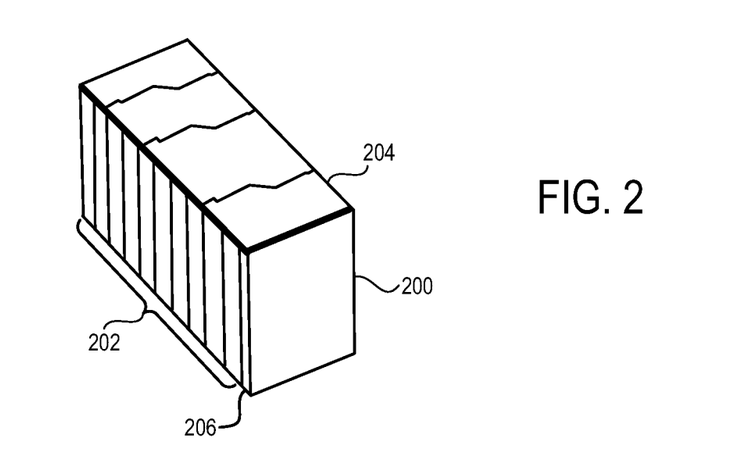
FIG. 2 shows a schematic view of an exemplary assembly of a battery cell stack.
Figure 3:
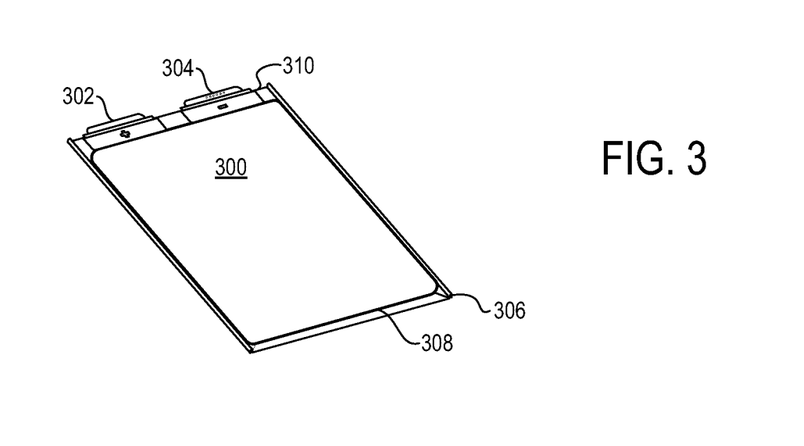
FIG. 3 shows a schematic view of an exemplary battery cell.
Figure 4:
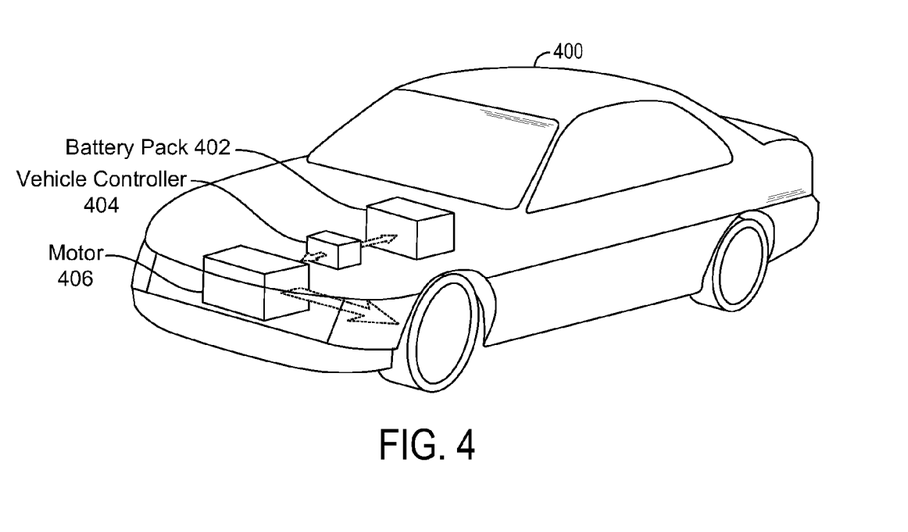
FIG. 4 shows a schematic view of a battery control system in a motor vehicle.

The present description is related to assessing operation of ADCs within a battery pack supplying power to a vehicle. In one embodiment, the battery pack may be designed to include an enclosure and structure as is illustrated in FIG. 1. The battery pack may be comprised of one or more battery cell stacks, an example of which is illustrated in FIG. 2. The battery cell stacks are comprised of a plurality of battery cells, an example of which is illustrated in FIG. 3. A non-limiting application of a battery pack is illustrated in FIG. 4.

ADC operation may be assessed by comparing the output of two ADCs. Specifically, an example system such as that depicted in FIG. 5 may be configured to assess operation of several ADCs located within a battery pack. In one example, battery cells may be assembled and configured with battery cell stacks. The voltage of each battery cell of a battery cell stack may be monitored and regulated by a monitor and balance board (MBB) that is coupled to the battery cell stack. The MBB may be configured with a first ADC that has a higher resolution (e.g., 12-bit resolution) and a second lower resolution second ADC (e.g., 8 bit resolution). The output of the first ADC may be compared against the output of the second ADC to determine differences in ADC measurements. Further, the voltages of individual battery cell stacks measured by the first ADC may be compared to the voltage of the battery pack measured by the second ADC. Accordingly, such a system allows ADCs of the battery pack to cross check other ADCs of the battery pack, thereby providing a system self-check and redundancy within the battery pack.

Referring now to FIG. 1, an example battery pack 100 is illustrated. Battery pack 100 includes battery cell stack 102, coolant circuit 104, electrical distribution module (EDM) 106, and BCM 108. In the depicted embodiment, coolant enters the coolant circuit at coolant connector 110. Further, coolant circuit 104 is in thermal communication with battery cell stack 102 via conductive grease 118 and a cold plate 120. When heat is generated by cell stack 102, coolant circuit 104 transfers the heat to a location outside of battery pack 100. In one embodiment, coolant circuit 104 may be in communication with a vehicle radiator when the battery pack is coupled in a vehicle.

Voltage of battery cells in battery cell stack 102 is monitored and balanced by MBB 116, which may include a plurality of current, voltage, and other sensors. The EDM 106 controls the distribution of power from the battery pack to the battery load and may include a current sense module (CSM) (not shown). In particular, EDM 106 contains contacts for coupling high voltage battery power to an external battery load such as an inverter. The BCM 108 controls ancillary modules within the battery pack such as the EDM and cell MBB, for example. Further, the BCM may be comprised of a microprocessor having random access memory, read only memory, input ports, real time clock, output ports, and a computer area network (CAN) port for communicating to MBBs and other battery pack modules. Humidity sensor 122 and temperature sensor 124 provide internal environmental conditions of battery pack 100 to BCM 108.

Referring now to FIG. 2, an exemplary assembly of a battery stack 200 is shown. Battery stack 200 is comprised of a plurality of battery cells 202. In some embodiments, the battery cells may be lithium-ion battery cells, for example. In the example of FIG. 2, battery stack is comprised of ten battery cells. Although battery stack 200 is depicted as having ten battery cells, it should be understood that a battery stack may include more or less than ten cells. For example, the number of cells in a battery stack may be based on an amount of power desired from the battery stack. Within a battery cell stack, cells may be coupled in series to increase the battery cell stack voltage, or battery cells may be coupled in parallel to increase current capacity at a particular battery cell voltage. Further, a battery pack, such as battery pack 100 in FIG. 1, may be comprised of one or more battery cell stacks. As shown in FIG. 2, battery stack 200 further includes cover 206 which provides protection for battery bus bars (not shown) that route charge from the plurality of battery cells to output terminals of a battery pack. Battery stack 200 also includes one or more MBB 206. MBB 206 is shown at the front end of battery stack 200, but an additional MBB may be included at the back or opposite side of battery stack 200 depending on the battery stack configuration.

Turning now to FIG. 3, an exemplary embodiment of an individual battery cell is shown. Battery cell 300 includes cathode 302 and anode 304 for connecting to a bus (not shown). The bus routes charge from a plurality of battery plates to output terminals of a battery pack and is coupled to bus bar support 310. Battery cell 300 further includes prismatic cell 308 that contains electrolytic compounds. Prismatic cell 308 is in thermal communication with heat sink 306. Heat sink 306 may be formed of a metal plate with the edges bent up 90 degrees on one or more sides to form a flanged edge. In the example of FIG. 3, the bottom edge, and sides, each include a flanged edge.

When a plurality of cells is put into a stack, the Prismatic cells are separated by a compliant pad (not shown). Thus, a battery cell stack is built in the order of heat sink, Prismatic cell, compliant pad, Prismatic cell, heat sink, and so on. One side of the heat sinks (e.g., flanged edges) may then contact the cold plate to improve heat transfer.

Referring now to FIG. 4, a schematic view of a non-limiting application of the present system and method is shown. In particular, battery pack 402 is installed in a vehicle 400 for the purpose of supplying energy to propel vehicle 400 by way of electric motor 406. As shown in FIG. 4, vehicle controller 404 may facilitate communication between battery pack 402 and motor 406. In one embodiment, vehicle 400 may be propelled solely by electric motor 406. In another embodiment, vehicle 400 may be a hybrid vehicle that may be propelled by an electric motor and an internal combustion engine.

Figure 5:
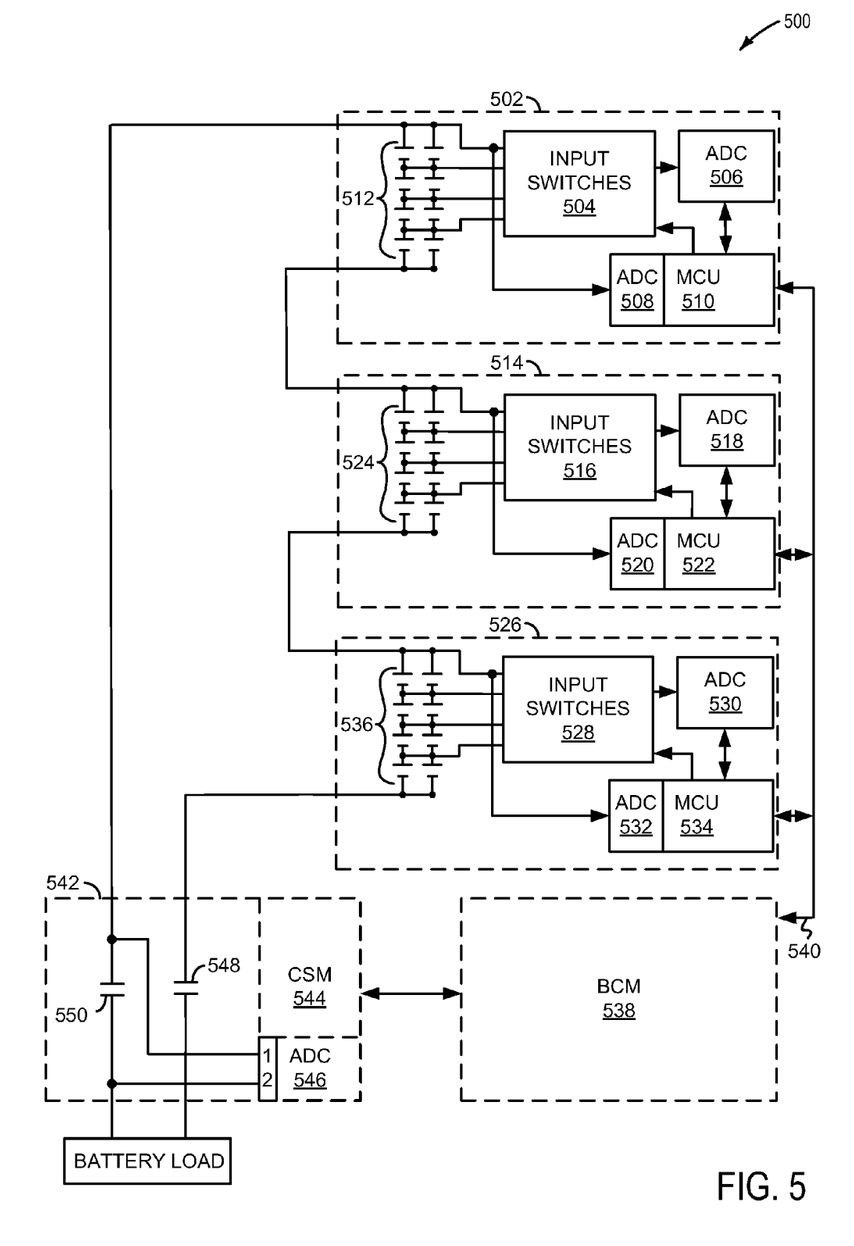
FIG. 5 shows a schematic view of a system for assessing ADC operating and battery voltages.

Referring now to FIG. 5, a schematic diagram of a system for assessing ADC operation and battery voltages within a battery pack 500 is shown. In this example, battery pack 500 includes three battery cell stacks 502, 514, and 526 as indicated by the dashed lines. Battery cells 512, 524, and 536 are shown identically configured and are connected in series. However, battery cell stacks may be configured with different numbers of battery cells, and the battery cells may be configured differently if desired. For example, battery cells 512, 524, and 536 are comprised of eight battery cells each. Four of the battery cells are arranged in series. Further, the four battery cells are arranged in parallel with four other battery cells that are arranged in series. In this configuration, each battery cell stack 502, 514, and 526 outputs a voltage that is related to the number of battery cells connected in series as well as the individual voltage output of each battery cell. And, as discussed above, the current capacity or amp-hour rating of the battery cell stack may be related to the number of battery cells connected in parallel. As the number of battery cells arranged in parallel increases, the battery cell stack amp-hour rating increases. As the number of battery cells arranged in series increases, the output voltage of the battery cell stack increases.

Thus, the voltage output of a battery pack can be increased or decreased by changing the number of battery cells arranged in a series connection. Likewise, the battery pack amp-hour rating may be increased or decreased by changing the number of battery cells arranged in parallel. Therefore, in this example the battery pack voltage may be increased by adding additional battery cells in series with the battery cells of battery cell stacks 502, 514, and 526. Alternatively, the battery cell stack amp-hour rating may be increased by adding more battery cells in parallel to battery cells 512, 524, and 536.

Battery cell stacks 502, 514, and 526 include input switches 504, 516, and 528 for selectively coupling ADCs 506, 518, and 530 to battery cells 512, 524, and 536 respectively. MCUs 510, 522, and 534 control the state of switches 504, 516, and 528 by way of digital outputs from the respective MCUs. Input switches 504, 516, and 528 are configured such that ADCs 506, 518, and 530 may be coupled to individual battery cells to measure battery cell voltage without being influenced by the voltage of battery cells that may be placed in series with the battery cell being measured. In one embodiment, each MCU 510, 522, and 534 may couple each series connected battery cell to respective ADCs 506, 518, and 530. When battery cells are coupled in parallel, input switches 504, 516, and 528 couple ADCs 506, 518, and 530 to the battery cells of a cell stack that are coupled in parallel. Thus, each ADC coupled to a battery cell stack may be configured to measure the voltage of one or more battery cells coupled in parallel within the respective battery cell stack.

ADCs 506, 518, and 530 are configured as high resolution (e.g., 12 or 16 bit resolution ADCs) devices that are external or off chip from MCUs 510, 518, and 534, although ADCs may be on chip in other embodiments and may have different resolutions (e.g., 8 bit resolution). In one example, ADCs 506, 518, and 530 communicate to MCUs 510, 518, and 530 respectively by way of SPI ports. The SPI ports are used to transfer battery cell voltages to each MCU as the individual MCUs command input switches 504, 516, and 528 to cycle through battery cells 512, 524, and 536 respectively. By cycling through the switches, individual series battery cells are coupled to ADCs 506, 518, and 530 for determining battery cell voltages.

ADCs 508, 520, and 532 are lower resolution (e.g., 8 bit resolution) devices that are integrated to MCUs 510, 522, and 534. In alternate embodiments, ADCs 508, 520, and 532 may be of higher resolution (e.g., 12 or 16 bit resolution) and external from MCUs 510, 522, and 534. ADCs 508, 520, and 532 are configured to measure the series voltage provided by battery cells 512, 524, and 536 for the respective battery cell stacks 502, 514, and 526. For example, ADC 508 is configured to measure the voltage provided by the series combination of four battery cells coupled in parallel to four other battery cells, the battery cells indicated at 512. Thus, the ADC of an MBB is configured to measure the series combination of battery cells of a battery cell stack. Of course, an ADC of a MBB coupled to a battery cell stack may be configured to measure the voltage of additional or fewer battery cells than the four battery cells shown in FIG. 5. Further, as discussed above, the series combination of battery cells 512 acts to increase the output voltage of the battery cell stack 502.

MCUs 510, 522, and 534 control input switches 504, 516, and 528 as well as ADCs 506, 508, 518, 520, 530, and 532. Further, MCUs 510, 522, and 534 may store the respective battery voltages to memory and perform arithmetic and logical operations on battery voltage data captured by ADCs 506, 508, 518, 520, 530, and 532. In one example, BCM 538 is also configured to compare the battery pack voltage data provided by ADC 546 to the battery cell stack voltages provided by MCUs 510, 522, and 530. In one example, MCUs 510, 522, and 534 adds the battery cell stack voltages provided to MCUs 510, 522, and 534 by ADCs 506, 518, and 530 to form a sum of battery cell voltages for each battery cell stack. The sum of battery cell voltages are then compared to the battery cell stack voltages as measured by ADCs 508, 520, and 532.

If each battery pack voltage is within a predetermined range of each sum of battery cell stack voltages, MCUs 510, 522, and 534 may store the battery pack and battery cell data in memory and report a pass or clear status to the BCM 538. For example, if the battery cell voltages of battery cell stack 502 provided by ADC 506 are summed, and the sum is within a predetermined range of the battery stack voltage provided by ADC 508, then MCU 510 may report favorable passage of a self test diagnostic to BCM 538. On the other hand, if the battery cell voltages of battery cell stack 502 provided by ADC 506 are summed, and the sum is not within a predetermined range of the battery stack voltage provided by ADC 508, then MCU 510 may report an indication of degradation of a battery stack system to BCM 538. Likewise, voltages of battery cell stack 514 may be determined from ADC 518 and ADC 520, and the voltages may then be compared by MCU 522. Similarly, voltages of battery cell stack 526 may be determined from ADC 530 and ADC 532, and the voltages may then be compared by MCU 534.

BCM 538 communicates with MCUs 510, 522, and 534 of battery cell stacks 502, 514, and 526 by way of CAN bus 540. BCM 538 may acquire battery voltages and status indicators (e.g., flags that indicate degradation of an ADC, battery cell, or MCU) from battery cell stacks 502, 514, and 526. BCM 538 also communicates with EDM 542 for sending instructions to close contactors 550 and 548 when it is desirable to couple battery cell stacks 502, 514, and 526 to the battery load. CSM 544 includes an ADC 546 for measuring battery pack voltage on the battery side of contactors 550 and 548. In some embodiments, ADC 546 or another ADC may also measure battery pack voltage on the load side of contactors 550 and 548. ADC 546 provides BCM 538 with battery pack voltage data.

BCM 538 is also configured to compare the battery pack voltage data provided by ADC 546 to the battery cell stack voltages provided by MCUs 510, 522, and 534. In one example, BCM 538 adds the battery cell stack voltages provided to BCM 538 by MCUs 510, 522, and 534 to form a sum of battery cell stack voltages which is then compared to the battery pack voltage as measured by ADC 546. If the battery pack voltage is within a predetermined range of the sum of battery cell stack voltages, BCM may store the battery pack and battery cell data in memory and report a pass or clear status to an external system. For example, if the battery cell stack voltages are summed and within a predetermined range of the battery pack voltage, then BCM 538 may report favorable passage of a self test diagnostic to a vehicle controller. On the other hand, if the battery cell stack voltages are summed and not within a predetermined range of the battery pack voltage, then BCM 538 may report an indication of degradation of a battery pack system to a vehicle controller.

Thus, the system described in FIGS. 1-5 provides for a system for assessing ADC operation and voltage of a battery, comprising: a first ADC for determining a voltage of at least one battery cell; a second ADC for determining a voltage of a plurality of battery cells; and a controller including instructions for performing an action in response to comparing an output of said first ADC to an output of said second ADC. By comparing the outputs of two ADCs it is possible to determine if degradation of an ADC is present. The system includes wherein the first ADC is external to the controller and is configured to monitor individual battery cell voltages of a battery cell stack and wherein the second ADC is integrated in the controller and is configured to monitor a voltage of a plurality of battery cells. The system also includes wherein the controller includes further instructions for comparing a sum of individual battery cell voltage measurements from the first ADC to a measurement of a single voltage from the second ADC, the single voltage from the second ADC provided via a plurality of battery cells.

In one example, the system includes wherein the comparing includes determining a difference between the sum of individual battery cell voltage measurements from the first ADC and a single output from the second ADC. The system also includes wherein the controller reports degradation of an ADC to a second controller when the controller determines a difference between the output of the first ADC and the output of the second ADC. The system also includes wherein the action includes adjusting a discharge limit of the battery. The system also includes wherein the at least one battery cell is included in the plurality of battery cells. The system also includes wherein the action includes adjusting a charging limit of the battery.

The system described in FIGS. 1-5 also provides for a system for assessing ADC operation and voltage of a battery, comprising: a plurality of ADCs, each ADC of said plurality of ADCs configured to determine a voltage of a battery cell stack; an ADC configured to determine a voltage produced by a plurality of battery cell stacks; and a controller including instructions for performing an action in response to comparing an output from each of said plurality of ADCs to an output of said ADC configured to determine said voltage produced by said plurality of battery cell stacks. In this way, the system can determine ADC degradation and take appropriate action. The system includes wherein the battery cell stack is included in the plurality of battery cell stacks. The system also includes wherein each ADC of the plurality of ADCs are coupled to a battery cell stack.

In one example, the system includes wherein the controller includes further instructions for judging one or the other of the ADCs configured to determine the voltage produced by the plurality of battery cell stacks, or the plurality of ADCs, to be degraded in response to the comparing of the output from each of the plurality of ADCs to the output of the ADC configured to determine the voltage produced by the plurality of battery cell stacks. The system includes wherein the comparing the output from each of the plurality of ADCs to the output of the ADC configured to determine the voltage produced by the plurality of battery cell stacks includes determining a difference between a sum of each of the output of the plurality of ADCs to the ADC configured to determine the voltage produced by the plurality of battery cell stacks. The system includes wherein the action includes selecting one or the other of the output from each of the plurality of ADCs, or the ADC configured to determine the voltage produced by the plurality of battery cell stacks, for adjusting battery voltage. The system also includes wherein the plurality of battery cell stacks are lithium-ion battery cell stacks.

Figure 6:
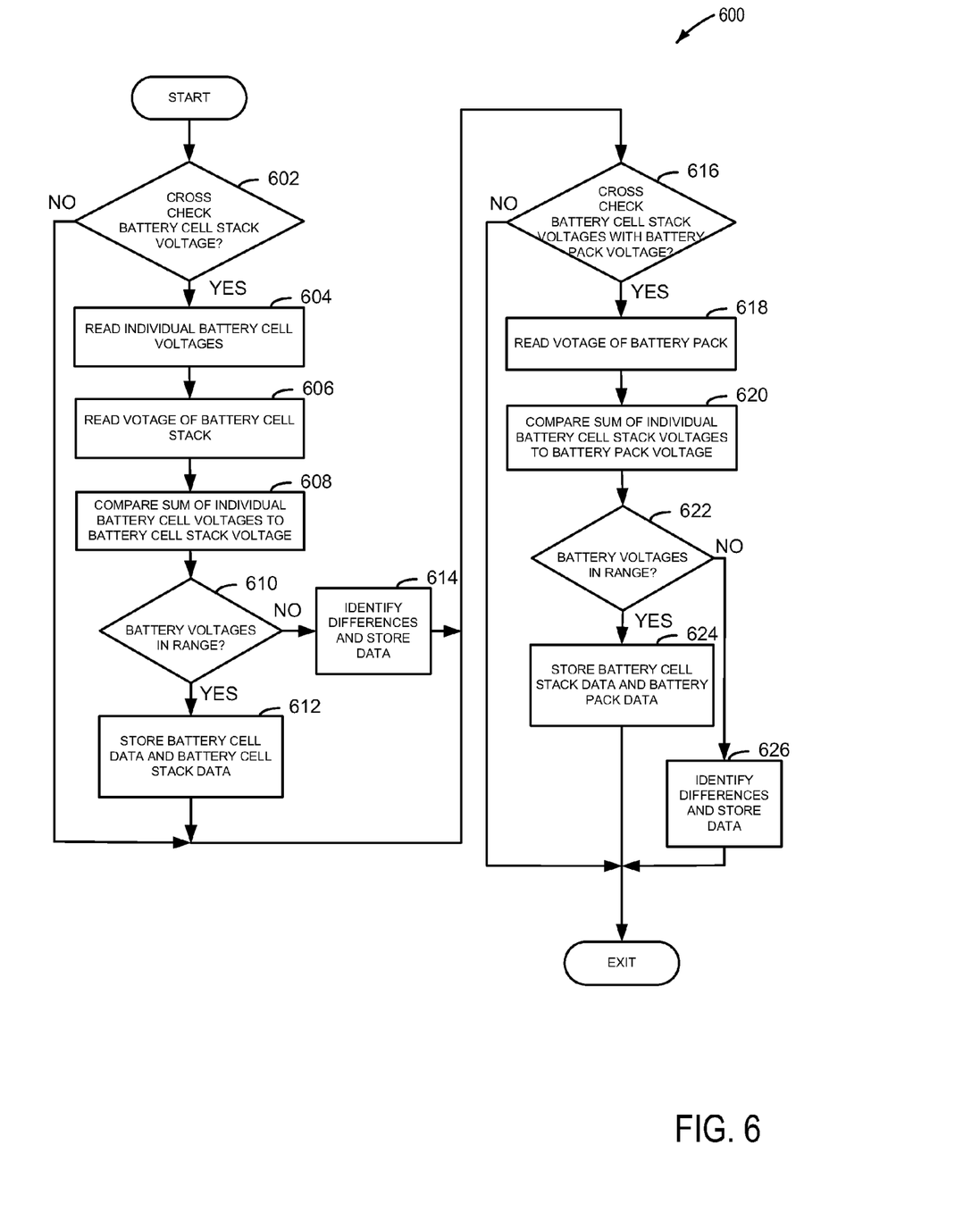
FIG. 6 shows a flow chart illustrating a method for assessing ADC operation and battery voltages.

Referring now to FIG. 6, a flow chart of a method for assessing ADC operation and battery voltages is shown. The method of FIG. 6 is executable via controller instructions in the system described in FIGS. 1-5.

At 602, routine 600 judges whether or not to cross check or compare battery cell stack battery cell voltages. Routine 600 may judge to compare battery cell stack battery cell voltages during a battery pack sleep state, upon battery pack power up, or during battery pack operation. In embodiment, routine 600 may compare battery cell stack battery cell voltages as part of a diagnostic routine. If routine 600 judges to compare battery cell state battery cell voltages, routine 600 proceeds to 604. Otherwise, routine 600 proceeds to 616.

At 604, routine 600 reads individual battery cell voltages, the individual battery cells included in a battery cell stack. Note that in battery cell stacks where battery cells are coupled in parallel, a single measurement of multiple battery cells may be taken as the battery cells in parallel output a single voltage. The battery cells of a battery cell stack may be read by selectively coupling each battery cell to a first ADC. The first ADC may be a higher resolution device (e.g., 12-16 bit resolution) and may be incorporated into a MBB that is coupled to the battery cell stack. In other embodiments, the first ADC may be remote from the battery cell stack and/or may be of higher or lower resolution. The first ADC output for each battery cell voltage combined in series may be directed from the first ADC to a MCU and stored in memory. In one embodiment, the MCU selects the order of battery cell sampling and the sampling time of the first higher resolution ADC. After all battery cells of the battery cell stack are measured by the first ADC, routine 600 proceeds to 606.

At 606, the voltage of the battery cell stack is determined by a second ADC. In one embodiment, the second ADC may be a lower resolution and integrated into the MCU. In another embodiment, the second ADC may be a higher resolution and separate from the MCU. The battery cell stack voltage is comprised of the voltages of individual battery cells coupled in parallel to form a single higher voltage. For example, eight battery cells each with an output of 1 volt may be combined in series to provide a single battery cell stack voltage of 8 volts. In another example, eight battery cells, each battery cell with an output of 1 volt may be combined, four battery cells in series, the four series battery cells in parallel with four other battery cells that are coupled in series. In this combination, the eight battery cells output a single voltage of 4 volts. Once the battery cell stack voltage is measured by the second ADC the result is stored in memory by a MCU. After measuring the battery cell stack voltage, routine 600 proceeds from 606 to 608.

At 608, routine 600 compares the sum of individual battery cell voltages to the voltage of the battery cell stack. For example, a total of eight battery cells, each battery cell with an output of 1 volt may be combined, four battery cells in series, the four series battery cells in parallel with four other battery cells that are coupled in series. In this example, a higher resolution ADC makes four battery cell voltage measurements of the battery cells combined in series. The battery cell voltage measurements are then stored in memory by a MCU. The battery cell stack voltage as measured by a second ADC is also stored in memory by the MCU. In one example, the MCU sums the four individual battery cell voltage measurements and determines a difference between the sum of battery cell voltages and the battery cell stack voltage. For example, individual voltages from the four battery cells may be 0.98 volts; 1.01 volts; 1 volt; and 1.02 volts, the sum of battery voltages being 4.01 volts. On other hand the second ADC may indicate a battery cell stack of 4.0 volts. Therefore, there is a difference between the sum of battery cell voltages in the battery cell stack and the battery cell stack voltage of 0.01 volts. In one embodiment, the difference between the sum of battery cell voltages and the battery cell stack voltage may be the referred to as the error between the measurements attributable to the first and second ADCs. After comparing ADC measurements routine 600 proceeds from 608 to 610.

At 610, routine judges whether or not the sum of individual battery cell voltages is in range of the battery cell stack voltage. The desirable range between the sum of individual battery cell voltages and the battery cell stack may vary depending on the resolution of the first and second ADCs and/or the number of battery cells in the battery cell stack. Further, the desirable range between the sum of individual battery cell voltages and the battery cell stack may vary depending on battery operating conditions (e.g., battery temperature). In one example, when the error between measurements attributable to the first and second ADCs is within a desired range when the error is less than 0.2 volts. If routine 600 judges the battery cell voltages in a desired range, routine 600 proceeds to 612. Otherwise, routine 600 proceeds to 614.

At 612, routine 600 stores the battery stack voltage and the battery cell stack battery cell voltages in memory. The battery cell voltages and battery stack voltage may be stored for diagnostic purposes and retrieved at a later time. Further, routine 600 may send an indication of desirable completion of a diagnostic routine at 612. In one embodiment, an MBB may send an indication of a desirable completion of a diagnostic routine to a BCM. After storing battery cell data routine 600 proceeds from 612 to 616.

In an alternative embodiment, the second ADC, whether internal or external to the MCU, may sample the voltage of each battery cell within a battery cell stack. The output of the second ADC from each battery cell may be compared to the output of the first ADC from each battery cell. In another example, a sum of measurements from the second ADC, the sum of second ADC measurements from each battery cell of a battery cell stack, is compared to the sum of measurements from the first ADC, the sum of first ADC measurements from each battery cell of a battery cell stack. If the voltage comparison indicates an error greater than a predetermined amount, an indication of degradation may be provided by the battery cell stack MCU.

At 614, routine 600 stores the battery stack voltage and the sum of battery cell stack battery cell voltages in memory and identifies and stores differences between battery cell stack voltage and the sum of battery cell stack battery cell voltages. Further, the individual battery cell voltages may be stored for diagnostic purposes and retrieved at a later time. Routine 600 also sends an indication of completion of a diagnostic routine where there is an error between the sum of battery cell voltages and the battery cell stack voltage. In one embodiment, an MBB may send an indication of completion of a diagnostic routine where there is an error between the sum of battery cell voltages and the battery cell stack voltage to a BCM. An indication of completion of the diagnostic routine where there is an error between the sum of battery cell voltages and the battery cell stack voltage may be indicative of degradation within the battery cell stack and MBB. After comparing ADC measurements routine 600 proceeds from 614 to 616.

At 616, routine 600 judges whether or not to cross check battery cell stack voltage with battery pack voltage. In one embodiment, the battery pack BCM compares the battery cell stack voltages to the battery pack voltage. Routine 600 may judge to compare battery cell stack voltages to battery pack voltage during a battery pack sleep state, upon battery pack power up, or during battery pack operation. Further, routine 600 may compare battery cell stack battery cell voltages and battery pack voltage as part of a diagnostic routine. In one embodiment, routine 600 may judge to compare battery cell stack voltage with battery pack voltage after comparing voltages of individual battery cells to the voltage of a battery cell stack and finding a difference greater than a predetermined amount. If routine 600 judges to compare battery cell stack voltages with battery pack voltage, routine 600 proceeds to 618. Otherwise, routine 600 proceeds to exit.

At 618, the battery pack voltage is read or measured by a third ADC. In one example, the battery pack voltage is read at a location of the battery high voltage bus that is upstream of contactors that control the flow of current to the battery load. In another example, the battery pack voltage is read at a location of the battery high voltage bus that is downstream of the contactors that control the flow of current to the battery load. The battery pack voltage is measured by a third ADC that is not included in the MBBs. However, it is also possible to measure the battery back voltage at the battery cell stack that is the last series configured battery cell stack. For example, if there are three battery cell stacks coupled in series, the battery pack voltage may be measured between the battery pack high voltage negative terminal and the battery cell that is at the highest potential of the battery pack that is at the highest potential. In this example, the third battery cell stack in the series combination, and the battery cell stack at the highest voltage potential relative to the high voltage bus negative terminal. In one embodiment, the third ADC is located on a CSM at a location near the battery pack load contactors, and its output is communicated to the BCM which stores the measurement to memory. After the battery pack voltage is measured or determined routine 600 proceeds to 620.

At 620, routine 600 compares the sum of individual battery cell stack voltages to the battery pack voltage. In one embodiment, the voltages of battery cell stacks are transferred from the battery cell stack MBBs to the BCM. The MBBs may send all the individual battery cell measurements from the first higher resolution ADC located on the MBB to the BCM, or the MBBs may send the sum of all individual battery cell measurements as determined from the higher resolution ADC measurements and the MCU to the BCM. The MBBs also send the battery cell stack voltage as measured or determined by the second lower resolution ADCs located on each MBB.

If a difference between the sum of battery cell voltages and the battery stack voltage of a battery cell stack has been indicted by at least one MBB to the BCM, the BCM sums the voltages of all battery cell stacks that have not exhibited a difference between the sum of battery cell voltages and the battery stack voltage with the low resolution battery cell stack voltage measurement as determined by the second ADC on the MBB that reported the difference. The BCM then compares the sum of battery cell stack voltages to the battery pack voltage determined by the third ADC. Further, the BCM sums the voltages of all battery cell stacks that have not exhibited a difference between the sum of battery cell voltages and the battery stack voltage with the sum of higher resolution battery cell voltage measurements as determined by the first ADC on the MBB that reported the difference.

The BCM then makes two battery pack voltage comparisons, one based on the first higher resolution ADC of the MBB reporting the difference between the sum of battery cell voltages and the battery stack voltage, and a second based on the second lower resolution ADC of the MBB reporting the difference between the sum of battery cell voltages and the battery stack voltage. If the comparison of the sum of battery cell stack voltages using the first higher resolution ADC of the MBB reporting a difference between the battery cell stack voltage as measured by the second ADC and the battery cell stack voltage as determined from the sum of battery cell voltages is closer to the battery pack voltage as determined by the third ADC, the BCM may determine that the second lower resolution ADC of the MBB reporting a difference between the battery cell stack voltage as measured by the second ADC and the battery cell stack voltage as determined from the sum of battery cell voltages is degraded. On the other hand, if the comparison of the sum of battery cell stack voltages using the second lower resolution ADC of the MBB reporting a difference between the battery cell stack voltage as measured by the second ADC and the battery cell stack voltage as determined from the sum of battery cell voltages is closer to the battery pack voltage as determined by the third ADC, the BCM may determine that the first higher resolution ADC of the MBB reporting a difference between the battery cell stack voltage as measured by the second ADC and the battery cell stack voltage as determined from the sum of battery cell voltages is degraded.

If routine 600 determines one ADC is operating at a less degraded state as compared to the other ADC, the BCM instructs the MBB to operate (e.g., controlling battery stack charging and discharging levels) according to the output of the ADC operating at a less degraded state.

If no MBBs are reporting differences between the battery cell stack voltage as measured by the second ADC and the battery cell stack voltage as determined from the sum of battery cell voltages, but the sum of battery stack voltages is different from the battery pack voltage by more than a predetermined amount, the BCM may determine that the third ADC measuring battery pack voltage may be degraded. A difference between the sum of battery cell stack voltages and the battery pack voltage may be determined by subtracting the battery pack voltages as measured by the third ADC from the sum of battery cell stack voltages. After the sum battery cell stack voltages is compared to the battery pack voltage, routine 600 proceeds to 622.

At 622, routine 600 judges whether or not the battery pack voltage is substantially equal to the sum of battery cell stack voltages. If the voltages are substantially the same (e.g. ±5 volts) routine proceeds to 624. Otherwise, routine 600 proceeds to 626.

At 624, routine 600 stores the sum of battery stack voltages and the battery pack voltage in memory. The sum of battery cell stack voltages and battery pack voltage may be stored for diagnostic purposes and retrieved at a later time. Further, routine 600 may send an indication of desirable completion of a diagnostic routine at 624. In one embodiment, the BCM may send an indication of a positive completion of a diagnostic routine to vehicle controller or to a controller that is external to the battery pack. After storing battery cell data routine 600 proceeds to exit.

At 626, routine 600 stores the battery pack voltage and the sum of battery cell stack voltages in memory and identifies and stores differences between battery cell pack voltage and the sum of battery cell stack voltages. Further, the individual battery stack voltages and the battery pack voltage may be stored in memory for diagnostic purposes and retrieved at a later time. Routine 600 also sends an indication of completion of a diagnostic routine where there is an error between the sum of battery cell stack voltages and the battery pack voltage. In one embodiment, the BCM may send an indication of completion of a diagnostic routine where there is an error between the sum of battery cell stack voltages and the battery pack voltage to a vehicle controller or a controller that is external from the battery pack. An indication of completion of the diagnostic routine where there is an error between the sum of battery cell stack voltages and the battery pack voltage may be indicative of degradation within the battery cell stack and MBB or the third ADC.

If routine 600 determines that ADC measurements from the MBBs are operating at a less degraded state as compared to the CSM third ADC, the BCM controls battery charging and discharging according to the voltages reported by the MBBs. On the other hand, if the BCM determines that the third ADC measurement by the CSM is less degraded than the ADC measurements provided by the BCMs, the BCM controls the battery charging and discharging according to the third ADC located at the CSM.

In this way, operation of ADCs and circuitry leading to the ADCs within a battery pack may be verified. Further, if degradation of an ADC is determined by an MCU on the MBB or by the BCM MCU, actions may be taken in response to the indicated degradation, providing an indication of ADC degradation for example.

Thus, the method of FIG. 6 provides for assessing ADC operation and voltage of a battery, comprising: measuring a plurality of voltages; measuring a first single voltage of a plurality of battery cells coupled in series; and responding to a comparison between said plurality of voltages and said first single voltage. The method includes wherein the first single voltage includes the plurality of voltages. In this way, battery cell voltages can be used to diagnose ADC operation. The method includes wherein the plurality of voltages are added into a second single voltage and wherein the comparison is a difference between the first single voltage and the single voltage. The method includes wherein the responding includes determining degradation of an ADC and reporting said degradation.

The method includes wherein the responding includes adjusting a charging or discharging limit of the battery. The method includes wherein the plurality of voltages is a plurality of battery cell voltages and wherein the single voltage is a voltage of a battery cell stack. In another example, the method includes wherein the plurality of voltages is a plurality of battery cell stack voltages and wherein the single voltage is a battery pack voltage. The method also includes wherein the measuring of the plurality of battery cell voltages includes measuring and storing a single voltage value for battery cells electrically coupled in parallel. The method also includes wherein voltages of the battery cells that are electrically coupled in parallel are added to voltages of battery cells of the plurality of battery cells that are coupled in series.

The subject matter of the present disclosure includes all novel and nonobvious combinations and subcombinations of the various systems and configurations, and other features, functions, and/or properties disclosed herein.

The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A system for assessing analog to digital converter (ADC) operation and voltage of a battery, comprising:
   a first ADC for determining a voltage of at least one battery cell;
   a second ADC for determining a voltage of a plurality of battery cells; and
   a controller including instructions for performing an action in response to comparing an output of said first ADC to an output of said second ADC.

2. The system of claim 1, wherein said first ADC is external to said controller and is configured to monitor individual battery cell voltages of a battery cell stack, and wherein said second ADC is integrated in said controller and is configured to monitor a voltage of a plurality of battery cells.

3. The system of claim 1, wherein the controller further includes instructions for comparing a sum of individual battery cell voltage measurements from said first ADC to a measurement of a single voltage from said second ADC, wherein said single voltage from said second ADC is provided via a plurality of battery cells.

4. The system of claim 3, wherein said comparing includes determining a difference between said sum of said individual battery cell voltage measurements from said first ADC and a single output from said second ADC.

5. The system of claim 1, wherein said controller further includes instructions for reporting a degradation of an ADC to a second controller when said controller determines a difference between said output of said first ADC and said output of said second ADC.

6. The system of claim 1, wherein said action includes adjusting a discharge limit of said battery.

7. The system of claim 1, wherein said at least one battery cell is included in said plurality of battery cells.

8. The system of claim 1, wherein said action includes adjusting a charging limit of said battery.

9. A system for assessing analog to digital converter (ADC) operation and voltage of a battery, comprising:
a plurality of ADCs, each ADC of said plurality of ADCs configured to determine a voltage of a battery cell stack;
an ADC configured to determine a voltage produced by a plurality of battery cell stacks; and
a controller including instructions for performing an action in response to comparing an output from each of said plurality of ADCs to an output of said ADC configured to determine said voltage produced by said plurality of battery cell stacks.

10. The system of claim 9, wherein said battery cell stack is included in said plurality of battery cell stacks.

11. The system of claim 9, wherein each ADC of said plurality of ADCs are coupled to a battery cell stack.

12. The system of claim 9, wherein said controller further includes instructions for judging one or the other of said ADCs configured to determine said voltage produced by said plurality of battery cell stacks, or said plurality of ADCs, to be degraded in response to said comparing said output from each of said plurality of ADCs to said output of said ADC configured to determine said voltage produced by said plurality of battery cell stacks.

13. The system of claim 9 wherein said comparing said output from each of said plurality of ADCs to said output of said ADC configured to determine said voltage produced by said plurality of battery cell stacks includes determining a difference between a sum of each of said output of said plurality of ADCs to said ADC configured to determine said voltage produced by said plurality of battery cell stacks.

14. The system of claim 9 wherein said action includes selecting one or the other of said output from each of said plurality of ADCs, or said ADC configured to determine said voltage produced by said plurality of battery cell stacks, for adjusting battery voltage.

15. The system of claim 9, wherein said plurality of battery cell stacks are lithium-ion battery cell stacks.

16. A method for assessing analog to digital converter (ADC) operation and voltage of a battery, comprising:
measuring a plurality of voltages of the battery via a controller and a first ADC;
measuring a first single voltage of the battery via the controller and a second ADC; and
responding to a comparison between said plurality of voltages and said first single voltage via the controller.

17. The method of claim 16 wherein said first single voltage includes said plurality of voltages.

18. The method of claim 16, wherein said plurality of voltages are added into a second single voltage and wherein said comparison is a difference between said first single voltage and said second single voltage.

19. The method of claim 16, wherein said responding includes determining a degradation of an ADC and reporting said degradation.

20. The method of claim 16, wherein said responding includes adjusting a charging or discharging limit of said battery.

* * * * *